(12) United States Patent
Kuo et al.

(10) Patent No.: US 7,091,126 B2
(45) Date of Patent: Aug. 15, 2006

(54) METHOD FOR COPPER SURFACE SMOOTHING

(75) Inventors: Han-Hsin Kuo, Tainan (TW); Hung-Wen Su, Jubei (TW); Wen-Chih Chiou, Miaoli (TW); Tsu Shih, Hsin-Chu (TW); Hsien-Ming Lee, Changhua (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 414 days.

(21) Appl. No.: 10/422,443

(22) Filed: Apr. 24, 2003

(65) Prior Publication Data

US 2004/0214441 A1 Oct. 28, 2004

(51) Int. Cl.
*H01L 21/302* (2006.01)

(52) U.S. Cl. .................... 438/692; 438/795; 427/595
(58) Field of Classification Search ............... 438/622, 438/637, 660, 690–692, 795, 653; 427/595
See application file for complete search history.

(56) References Cited

U.S. PATENT DOCUMENTS

| | | | | |
|---|---|---|---|---|
| 6,103,624 A | * | 8/2000 | Nogami et al. | 438/687 |
| 6,143,650 A | * | 11/2000 | Pramanick et al. | 438/643 |
| 6,500,753 B1 | | 12/2002 | Jang et al. | |
| 6,509,270 B1 | | 1/2003 | Held | |
| 6,524,950 B1 | | 2/2003 | Lin | |
| 6,582,777 B1 | * | 6/2003 | Ross et al. | 427/551 |

OTHER PUBLICATIONS

Streetman, Solid State Electronic Devices, 1990, Prentice Hall, 3rd e.dition, p. 339.*
Healy, Jerry, "Current Technical Trends: Dual Damascene & Low-k Dielectrics," © 2002 by Threshold Systems.

* cited by examiner

*Primary Examiner*—Nadine G. Norton
*Assistant Examiner*—Eric B. Chen
(74) *Attorney, Agent, or Firm*—Duane Morris LLP

(57) ABSTRACT

An improvement in a copper damascene process is disclosed. The improvement comprises the step of projecting an electron beam on to a chemical mechanically polished material surface having copper filled etched trenches at a known angle of incidence with respect to the material surface for a known period of time, the electron beam having a beamwidth substantially covering the material surface and a known intensity.

20 Claims, 6 Drawing Sheets

METHOD FOR COPPER SURFACE SMOOTHING

FIELD OF THE INVENTION

This application is related to the field of semiconductor manufacturing and more specifically to a method for smoothing a copper surface in a fabrication process

BACKGROUND OF THE INVENTION

Chemical Vapor Deposition (CVD) and Chemical-Mechanical Polishing (CMP) are well known methods for fabricating semiconductor circuits. CVD is one of the most common thin film deposition methods in semiconductor manufacturing. As is known, in this method materials are formed on a previously deposited layer as a result of a chemical reaction between gaseous reactants at an elevated temperature. A solid product of the reaction is then deposited on the surface of the previously deposited layer. Both metallic, semi-metallic and insulator materials may be deposited in this manner. Chemical-Mechanical Polishing (CMP) is a method of removing desired layers of a solid material for the purpose of planarizing the surface and also to define a metal interconnection pattern.

However, while planarization of the surface by the CMP process produces a reasonably smooth result, the grain of the material, particularly the deposited metal used for interconnection lines may be raised or grown when the semiconductor material is heat-treated in order to anneal the current layer or applying a next layer using additional CVD and/or CMP processing. Raising of the metal grain is disadvantageous as it distorts the smooth metal surface by creating ridges and valleys. The ridges and valleys thus may lead to unreliable results as a high quality connection between subsequently laid metal interconnection may not be created.

Accordingly, there is a need in the industry to provide a method for reducing the roughness created in the metal interconnection materials caused by the high temperatures used in the CVD process.

SUMMARY OF THE INVENTION

An improvement in a copper damascene process is disclosed. The improvement comprises the step of projecting an electron beam on to a chemical mechanically polished material surface having copper filled etched trenches at a known angle of incidence with respect to the material surface for a known period of time, the electron beam having a beamwidth substantially covering the material surface and a known intensity.

Figure 1A:
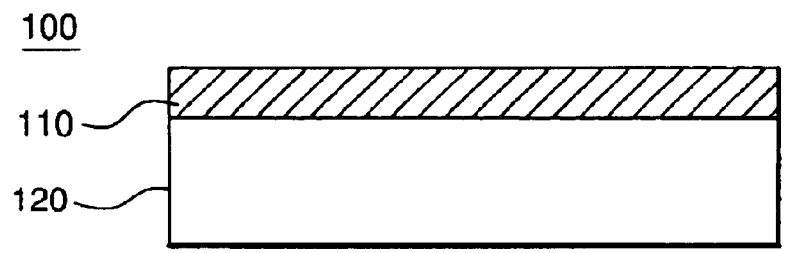
FIGS. 1a–1d illustrate a conventional CVD-CMP process in semiconductor fabrication.

It is to be understood that these drawings are solely for purpose of illustrating the concepts of the invention and are not intended as a definition of the limits of the invention. The embodiments shown in FIGS. 1 through 5 and described in the accompanying detailed description are to be used as illustrative embodiments and should not be construed as the only manner of practicing the invention. Also, the same reference numerals, possibly supplemented with reference characters where appropriate, have been used to identify similar elements.

DETAILED DESCRIPTION OF THE INVENTION

Figure 1B:
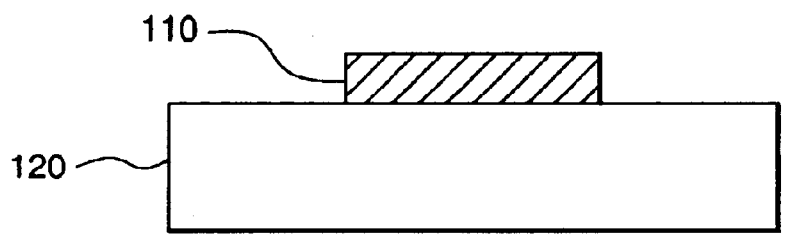
Figure 1C:
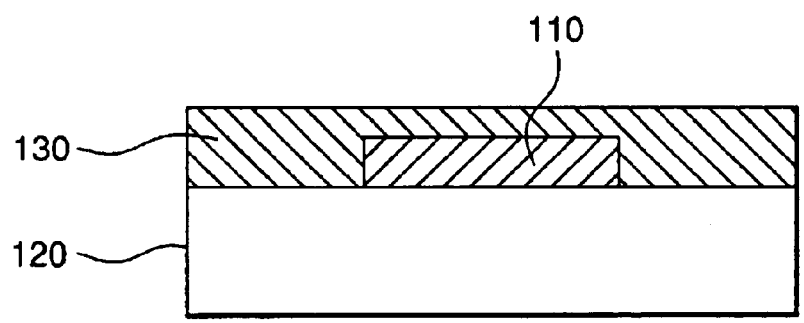
Figure 1D:
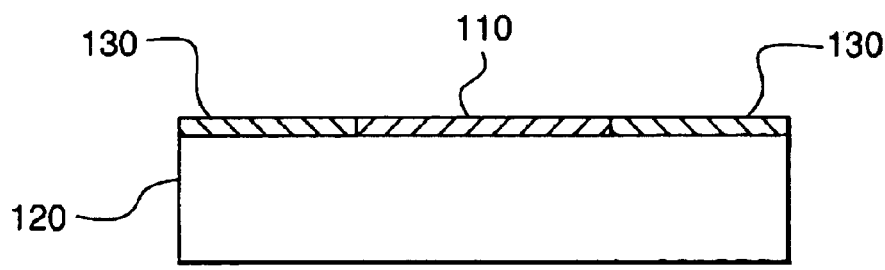

FIGS. 1a–1d illustrate a conventional cooper damascene CVD-CMP (Chemical Vapor Deposit-Chemical Mechanical Polishing) fabrications process. FIG. 1a illustrates the fabrication of semiconductor 100 by depositing layer 110 on substrate 120 using a conventional CVP processing. FIG. 1b illustrates the etching of the deposited layer 110 using known etching and photolithography methods, wherein substrate 120 is exposed through layer 110. FIG. 1c illustrates the deposition of layer 130 on layer 110 and substrate 120. FIG. 1d illustrates a CMP processing to expose layer 110 through layer 130. In one aspect, layer 110 may be a conductive material, such as aluminum, gold, silver, copper, that provides electrical connection between elements fabricated on the semiconductor material 120.

In another process, similar to that shown in FIGS. 1a–1d, referred to as damascene, electrical interconnection lines are marked or delineated in a dielectric material by means of a CMP process. In this case the interconnection pattern is defined in the semiconductor material by etching the pattern using conventional lithographic methods. The metal used as the interconnection material is next deposited on the semiconductor material and fills the voids or gaps etched into the semiconductor. A CMP process is then used to remove the deposited metal to isolate the metalized interconnection lines.

Figure 2A:
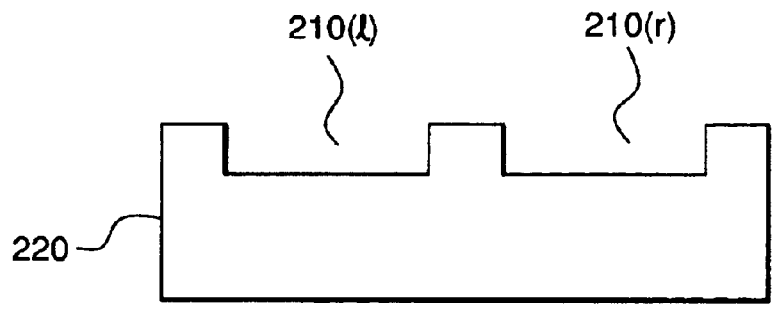
FIGS. 2a–2c illustrate a second conventional Copper Damascene CVD-CMP process in semiconductor fabrication.
Figure 2B:
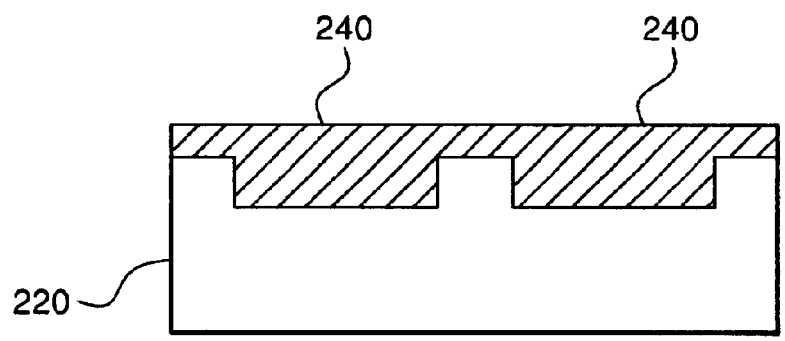
Figure 2C:
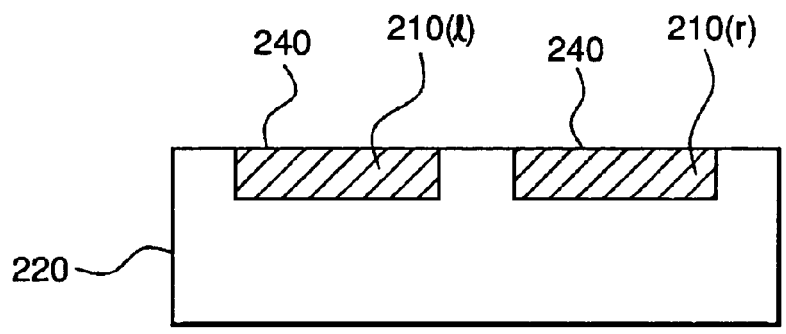

FIGS. 2a–2c illustrate a conventional damascene processing. FIG. 2a illustrates etching of interconnection lines 210(l), 210(r) within semiconductor material 220. FIG. 2b illustrates the depositing of a metal layer 240 on the surface of semiconductor material 220 and further filling interconnection lines 210(l), 210(r). FIG. 2c illustrates the results of a CMP process on metal layer 240 and a portion of semiconductor layer 220 that reduces metal layer 240 and semiconductor layer 220 such that metal material 240 in interconnection lines 210(l), 210(r) is smoothed and electrically isolated. A conventional copper based damascene process is more fully disclosed in commonly-assigned U.S. Pat. No. 6,524,950, entitled "Method of Fabricating Copper Damascene," issued Feb. 25, 2003, which is incorporated by reference herein. The '950 patent further discloses the problem of pitting that occurs in the copper material by the CMP process. A method for preventing the pitting of the copper lines is disclosed in commonly-assigned U.S. Pat. No. 6,500,753, entitled "Method to Reduce the Damages of Copper Lines," issued Dec. 31, 2002. The teachings of the '753 patent are also incorporated by reference herein.

Figure 2D:
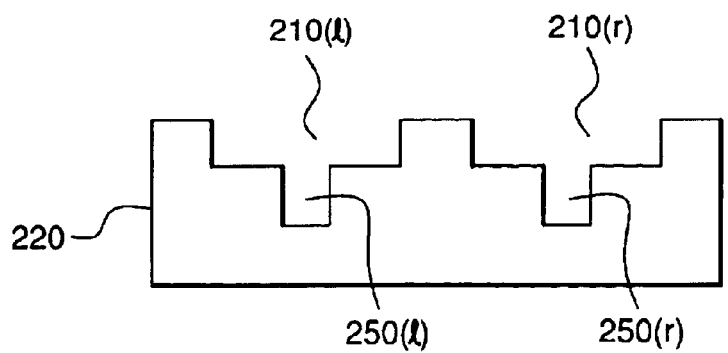
FIGS. 2d–2f illustrate a conventional Dual-Damascene CVD-CMP process in semiconductor fabrication
Figure 2E:
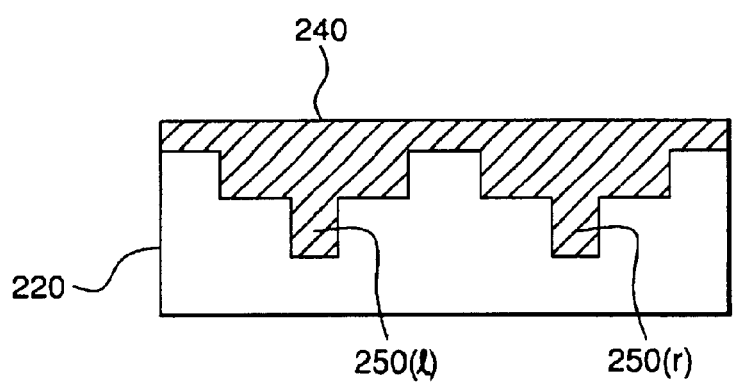
Figure 2F:
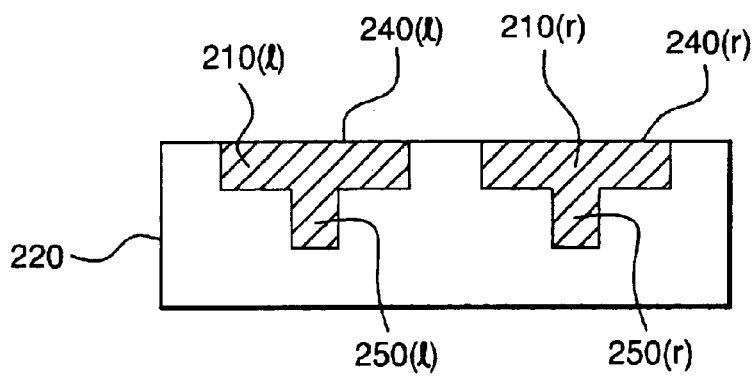

FIGS. 2d–2f illustrate a conventional dual-damascene processing. FIG. 2d illustrates etching of interconnection lines 210(l), 210(r) and corresponding via 250(l), 250(r) within semiconductor material 220. Via 250(l) and 250(r) allow interconnection lines 210(l), 210(r) to electrically connect to other layers (not shown) in material 220. As would be recognized by those skilled in the art, the dual-damascene process shown requires more than one etching step to be completed. Such etching procedures are well known in the are and need not be disclosed in detail herein.

FIG. 2e illustrates the depositing of a metal layer 240 on the surface of semiconductor material 220 and further filling interconnection lines 210(l), 210(r) and corresponding via 250(l), 250(r). FIG. 2f illustrates the results of a CMP process on metal layer 240 and a portion of semiconductor layer 220 that reduces metal layer 240 and semiconductor layer 220 such that metal material 240 in interconnection lines 210(l), 210(r) is smoothed and electrically isolated.

Figure 3:
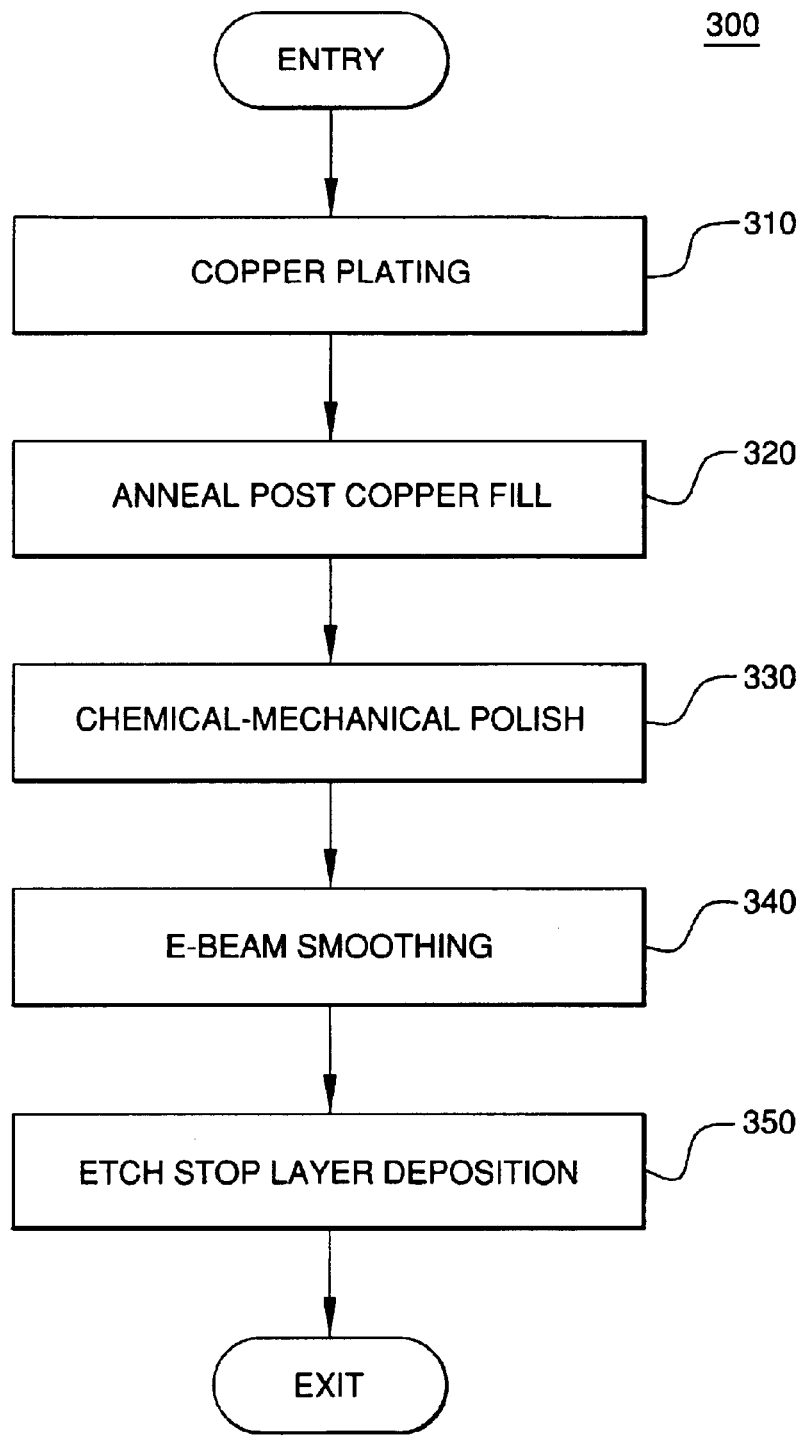
FIG. 3 illustrates a block diagram of CVD-CMP process in accordance with the principles of the invention.

FIG. 3 illustrates an exemplary process 300 for reducing the introduced defects in the metal layer in accordance with the principles of the present invention. In this process, copper plating of the substrate layer is performed at block 310. Commonly assigned U.S. Pat. No. 6,524,950 discloses the copper plating process in detail and are incorporated by reference herein. Accordingly, details of a copper plating process need not be discussed herein.

At block 320, a post-ECP (Electro-Chemical Plating) annealing process is performed. As previously discussed, the annealing process, which is in the order of 200–250 degrees centigrade, raises the temperature of the copper metal lines and, consequently, alters or causes ripples in the smooth copper surface. At block 330, a chemical-mechanical polishing is performed to smooth the material and copper surfaces. At block 340, an electron-beam impact process in accordance with the principles of the invention is performed. Electron-beam impact processing is advantageous as it prevents the further growth or raising of the metal grain during high temperature treating.

At block 350, an Etch Stop Layer (ESL) is grown on the e-beam smoothed surface of the substrate material. As is known, the substrate is heated, preferably between 350 and 400 degrees centigrade, to ensure the ESL is uniformly grown on the e-beam smoothed surface in preparation for the deposition of a next metallic, semiconductor, or insulating layer.

Figure 4:
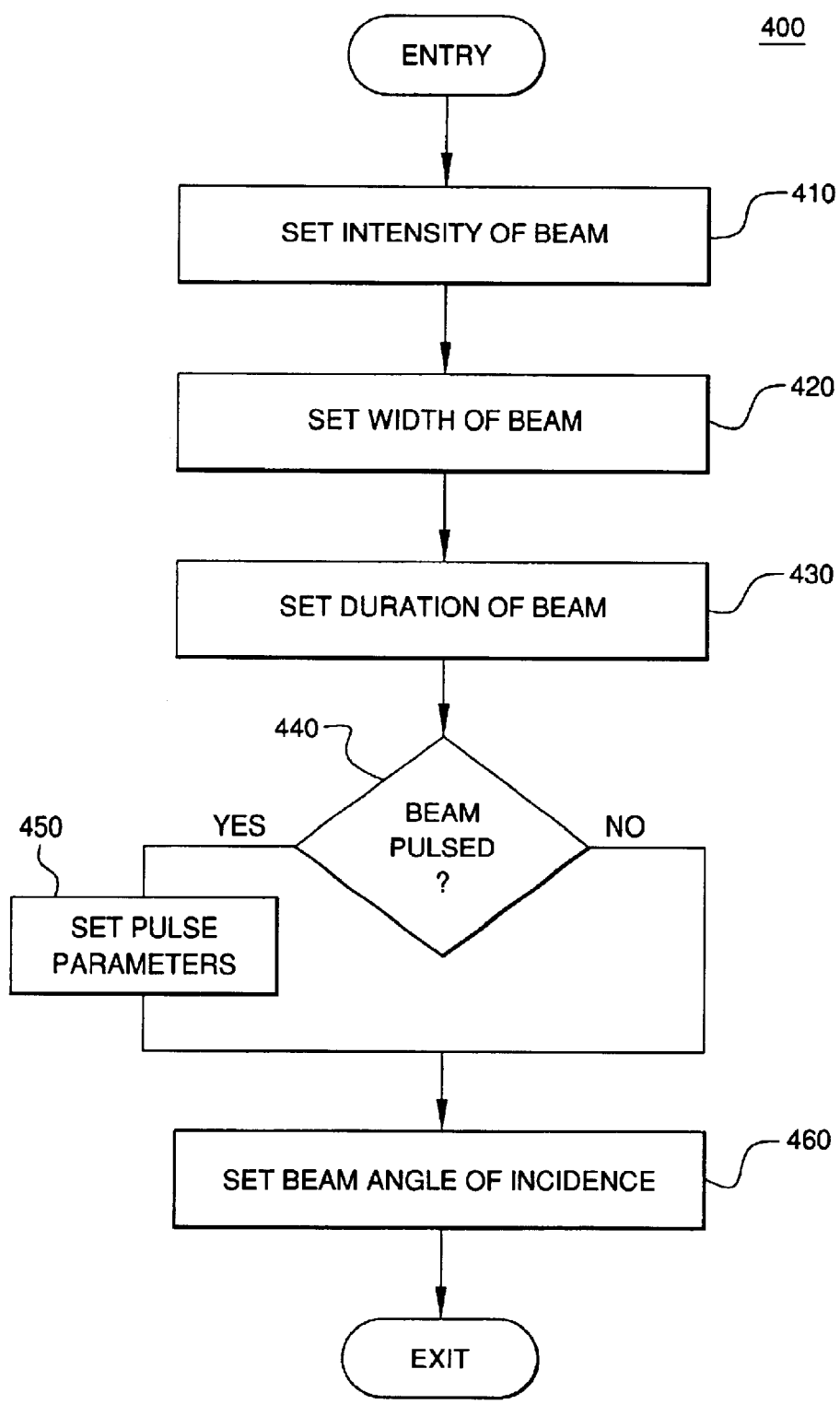
FIG. 4 illustrates an exemplary e-beam process in accordance with the principles of the present invention.

FIG. 4 illustrates an exemplary process 400 for e-beam processing in accordance with the principles of the invention. In this process, the intensity of the electron beam is set at block 410. Preferably, the intensity is set to be in the range of 1 to 30 KeVs (kilo-electron-volts). At block 420 the beam width of the electron beam is set. Preferably, the beam width is set to cover the entire surface of the wafer, substrate, or material surface. For example, the silicon wafer may range from about 4 square inches to as much as 256 square inches. As one skilled in the art would recognize, beam width may determined based on the wafer size and the distance between the wafer and the electron beam emission point.

At block 430, the time duration that the electron beam is applied to the wafer or material surface is set. In one aspect of the invention, the time duration may be set between 1 and 600 seconds. In a preferred embodiment of the invention, the electron beam duration and intensity are set to provide an electron dose in the range of 50 to 50,000 microColulomb per centimeter squared ($\mu C/cm^2$). At block 440 a determination is made whether the electron beam is to be continuously applied to the wafer or material surface or to be applied as a series of pulses. If the electron beam is applied as a series of pulses, then the number of pulses and the duration of each pulse, i.e., pulse width, is set at block 450. At block 460, the angle of incidence of the electron beam is set. As should be appreciated, the electron beam may be set from a substantially perpendicular position, i.e., 90 degrees, with respect to the substrate or wafer to a substantially parallel position, i.e., 0 degrees, with respect to the substrate or wafer. As should be appreciated, the parameters of the e-beam process are interrelated with regard to angle of beam incidence, beam width, time duration and, if pulsed, pulse-width and number of pulses. It should also be appreciated that the degree of smoothness desired in the plated copper surface may also contribute to the determination of the e-beam process parameters. For example, in one aspect of the invention, the e-beam parameters may be set up as shown in Table 1.

TABLE 1

| Exemplary e-beam characteristics | |
| --- | --- |
| Angle of Incidence | 90 degrees |
| Beam width | 100 eV |
| Time Duration | 10 seconds |
| Continuous | YES |

The use of e-beam processing in accordance with the principles of the invention is advantageous as the original grain size remains substantially the same, while the surface is much smoother. A smoother metal surface provides for improved interface contact between the copper metal layer and another surface.

Figure 5:
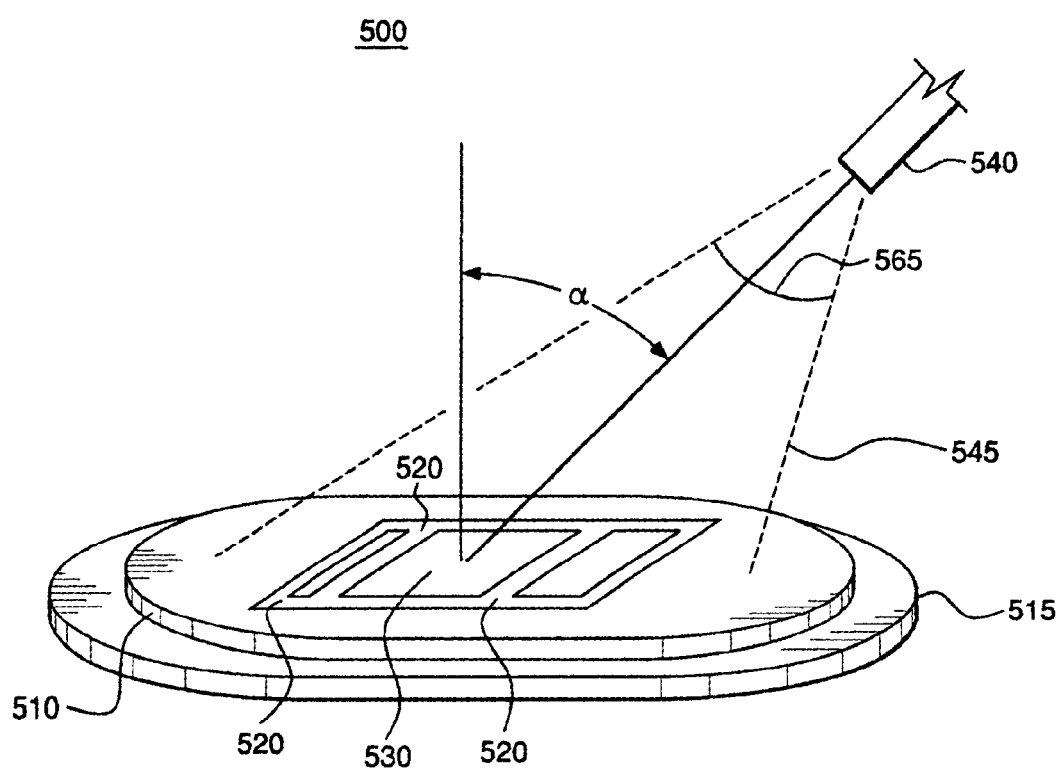
FIG. 5 illustrates an exemplary system configuration for e-beam copper smoothing in accordance with the principles of the invention.

FIG. 5 illustrates an exemplary system for performing e-beam copper smoothing in accordance with the principles of the invention. In this illustrative example, material 510 is shown on substrate 515. Within material 510 are etched trenches, represented as 520, that are filled with a copper material. Electron beam source 540 is directed towards material 510 such that an electron beam 545 substantially envelops material 510 and trenches 520. The beamwidth 565 of electron source 540 is selected to substantially envelop material 510 based on the distance of electron source 540 from substrate 515 and the size of material 510.

Electron beam source 540 is further set at an angle, $\alpha$, 560 with respect to substrate 515 and material layer 510. As should be appreciated angle, $\alpha$, 560 may be a complex angle with regard to the longitudinal and transverse axis of substrate 510.

While there has been shown, described, and pointed out fundamental novel features of the present invention as applied to preferred embodiments with regard to an Electro-Chemical Process, it will be understood that various omissions and substitutions and changes in the apparatus described, in the form and details of the devices disclosed, and in their operation, may be made by those skilled in the art without departing from the spirit of the present invention. For example, the invention may also be used with Plasma vapor deposition (PVD) and Elecroless copper deposition processes. PVD and Elecroless copper deposition processes are well known in the art and need not be discussed in detail herein.

It is expressly intended that all combinations of those elements that perform substantially the same function in substantially the same way to achieve the same results are within the scope of the invention. Substitutions of elements from one described embodiment to another are also fully intended and contemplated.

What is claimed is:

1. An improvement in a copper damascene process wherein an exposed surface of a material deposited on a substrate is etched and copper is deposited in said etched material surface, said deposited copper and material are polished using a CMP process to provide a copper surface, said improvement comprising the step of:

projecting an electron beam on to said material surface at a known angle of incidence with respect to said material surface for a known period of time, said electron beam having a beam width substantially covering said etched material surface including said copper surface and a known intensity.

2. The improvement as recited in claim 1, wherein said known angle of incidence is selected from an angle substantially parallel to said substrate to an angle substantially perpendicular to said substrate.

3. The improvement as recited in claim 1, wherein said known period of time is selected from a period between 0.01 and 600 seconds.

4. The improvement as recited in claim 1, wherein said known intensity is selected from a range of intensities between 1 and 30 KeV.

5. The improvement as recited in claim 1, wherein said electron beam is selected from the group consisting of: continuous wave, chopped continuous wave, pulsed.

6. The improvement as recited in claim 5, wherein said pulse electron beam further comprises a plurality of pulses, each having a known duration.

7. A method of fabricating flat-surface copper damascene comprising a plurality of damascene trenches in a material layer, which is formed on a substrate, said method comprising the steps of:

forming a conformal barrier layer and a copper seed layer sequentially in said damascene trenches and over said material layer;

performing a copper metal deposition process over said substrate;

performing a chemical-mechanical polishing process to remove portions of said copper and said material and produce a copper surface and a surface of said material; and smoothing said copper surface and said surface of said material by projecting an electron beam on to said material at a known angle of incidence with respect to said material for a known period of time, said electron beam having a beamwidth selected to substantially envelop said material including said copper surface and a known intensity.

8. The method as recited in claim 7, wherein said known angle of incidence is selected from an angle substantially parallel to said substrate to an angle substantially perpendicular to said substrate.

9. The method as recited in claim 7, wherein said known period of time is selected from a period between 0.1 and 600 seconds.

10. The method as recited in claim 7, wherein said known intensity is selected from a range of intensities between 1 and 30 KeV.

11. The method as recited in claim 7, wherein said electron beam is selected from the group consisting of: continuous wave, chopped continuous wave, pulsed.

12. The method as recited in claim 7, wherein said pulse electron beam further comprises a plurality of pulses, each having a known duration.

13. The improvement as recited in claim 1, wherein said electron beam dose is in the range of 50 to 50,000 $\mu C/cm^2$.

14. The improvement as recited in claim 1, wherein said copper damascene process is selected from the group consisting of: single process, dual process.

15. The improvement as recited in claim 1, wherein said damascene process is selected from the group consisting of: ECP, PVD, Electroless.

16. The method as recited in claim 7, wherein said electron beam dose is in the range of 50 to 50,000 $\mu C/cm^2$.

17. The method as recited in claim 7, wherein said copper damascene process is selected from the group consisting of: single process, dual process.

18. The method as recited in claim 7, wherein said damascene process is selected from the group consisting of: ECP, PVD, Electroless.

19. A method for forming a metal conductor comprising:

forming a dielectric layer over a substrate;

forming an opening in said dielectric layer;

forming a metal conductor in said opening; and providing an electron beam treatment on said metal conductor.

20. The method as in claim 19, wherein said metal conductor comprises a copper surface and said method further comprises annealing prior to said providing and wherein said projecting includes smoothing said copper surface and maintaining grain size of said copper surface substantially unchanged.

* * * * *